United States Patent [19]
Aoki et al.

[11] Patent Number: 5,192,879
[45] Date of Patent: Mar. 9, 1993

[54] MOS TRANSISTOR OUTPUT CIRCUIT

[75] Inventors: Kazuo Aoki; Daisuke Shichinohe, both of Itami, Japan

[73] Assignee: Mitsubishi Denki Kabushiki Kaisha, Tokyo, Japan

[21] Appl. No.: 765,577

[22] Filed: Sep. 25, 1991

[30] Foreign Application Priority Data

Nov. 26, 1990 [JP] Japan ................................ 2-324277

[51] Int. Cl.[5] .................... H03K 19/094; H03K 17/16
[52] U.S. Cl. .................................. 307/451; 307/475; 307/443; 307/448
[58] Field of Search ................ 307/475, 451, 448, 443

[56] References Cited

U.S. PATENT DOCUMENTS

| | | | |
|---|---|---|---|
| 3,769,523 | 10/1973 | Suzuki | 307/451 |
| 4,305,009 | 12/1981 | Miyagawa et al. | 307/264 |
| 4,825,101 | 4/1989 | Walters, Jr. | 307/270 |
| 4,961,010 | 10/1990 | Davis | 307/451 |
| 5,070,256 | 12/1991 | Grondalski | 307/451 |
| 5,095,230 | 3/1992 | Takai et al. | 307/451 |

FOREIGN PATENT DOCUMENTS

63-283315 11/1988 Japan .
2199712 7/1988 United Kingdom .

Primary Examiner—Edward P. Westin
Assistant Examiner—Richard Roseen
Attorney, Agent, or Firm—Thomas R. Morrison

[57] ABSTRACT

An MOS transistor output circuit includes a parallel combination of first and second circuits including transistors of different output characteristics in either or both of paths between an output terminal and a point of ground potential and the output terminal and a $V_{DD}$ voltage supply terminal. Upon transition of an input signal level, both first and second circuit become conductive so that the output circuit exhibits a large current driving capability which permits the output voltage to rapidly change until it approaches a predetermined level. When the output voltage reaches the predetermined level, one of the first and second circuits is turned off to thereby prevent the output circuit ON-resistance $R_{ON}$ from becoming excessively small, which, in turn, limits the circuit driving capability, whereby ringing in the output voltage is effectively prevented.

18 Claims, 7 Drawing Sheets

FIG. 11

MOS TRANSISTOR OUTPUT CIRCUIT

This application is related to U.S. patent application Ser. No. 07/400,907 filed Aug. 30, 1989, now U.S. Pat. No. 5,140,194.

The present invention relates to an output circuit for an MOS transistor circuit, and, more particularly, to such an output circuit acting as an inverter which can suppress ringing in an output voltage which could be caused by a resonant circuit formed by load capacitance connected to an output terminal of the circuit with inductance provided by, for example, wiring conductors.

BACKGROUND OF THE INVENTION

Recently, demand for digital data high-speed processing has increased. In an output circuit using MOS transistors, too, it has become required to drive a large load capacitance connected to an output terminal at a high speed. In order to increase the speed of such an output circuit for driving a large load capacitance, however, it is necessary to drive a resonant circuit formed by the load capacitance and an inductance provided by, for example, wiring conductors, with a large current driving capability. This may produce ringing in an output voltage waveform.

Figure 1:
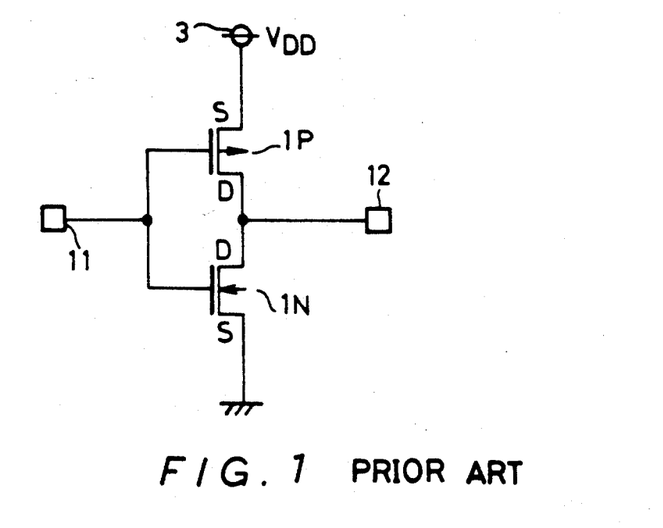
FIG. 1 shows a conventional MOS transistor output circuit.

FIG. 1 shows a conventional CMOS transistor output circuit, using MOS transistors, which functions as an inverter. In FIG. 1, an N-channel transistor 1N developing a low (L) level output and a P-channel transistor 1P developing a high (H) level output have their respective drains connected together to an output terminal 12, and also have their gates connected together to an input terminal 11. The source of the P-channel transistor 1P is connected to a $V_{DD}$ voltage supply terminal 3, and the source of the N-channel transistor 1N is connected to a point of ground potential.

In the output circuit of FIG. 1, when an H-level (high level) input signal is applied to the input terminal 11, the N-channel transistor 1N is turned on and the P-channel transistor 1P is turned off so that an L-level (low level) output is developed at the output terminal 12. When an L-level input signal is applied to the input terminal 11, the P-channel transistor 1P is turned on and the N-channel transistor 1N is turned off, so that an H-level output is developed at the output terminal 12.

In order for the conventional CMOS transistor output circuit of FIG. 1 to be able to drive a load at a high speed, the transistors 1N and 1P must have large current driving capability, which usually requires that the channel of each transistor be wide. If, however, the channel width of each transistor is made larger in order to increase its current driving capability, ringing could disadvantageously occur in the output voltage waveform.

Figure 2:
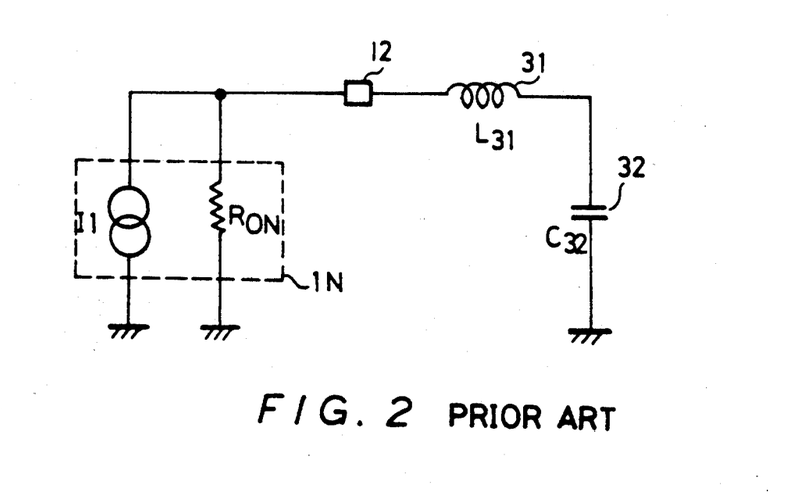
FIG. 2 shows an equivalent circuit of the output circuit of FIG. 1.

FIG. 2 is an equivalent circuit of a simplified model of an arrangement including a load to be driven coupled to the output terminal 12 of the output circuit shown in FIG. 1. The equivalent circuit of FIG. 2 corresponds to the circuit of FIG. 1 with the N-channel transistor 1N being conductive to provide the L-level output. The N-channel transistor 1N is represented by a parallel combination of a current source I1 and an ON-state resistor $R_{ON}$. A load capacitance 32 (of, for example, about 100 pF) is connected through an inductance 31 (of, for example, about 20 nH) to the output terminal 12. The inductance 31 is provided by, for example, wiring by leads, copper foil wiring on a printed circuit board, or bonding wires on an integrated circuit.

As will be understood from FIG. 2, the output circuit inclusive of the load provides a resonant circuit of which the resonant frequency $f_o$ is expressed by the following equation (1).

$$f_o = \tfrac{1}{2}\pi \cdot \sqrt{L_{31}C_{32}} \qquad (1)$$

where $L_{31}$ is the value of the inductance 31, and $C_{32}$ is the value of the capacitance 32.

Q at the resonant frequency $f_o$ is expressed by the following equation (2), where $2\pi f_o = w_o$.

$$Q = jw_o L_{31}/R_{ON} \qquad (2)$$

Figure 3:
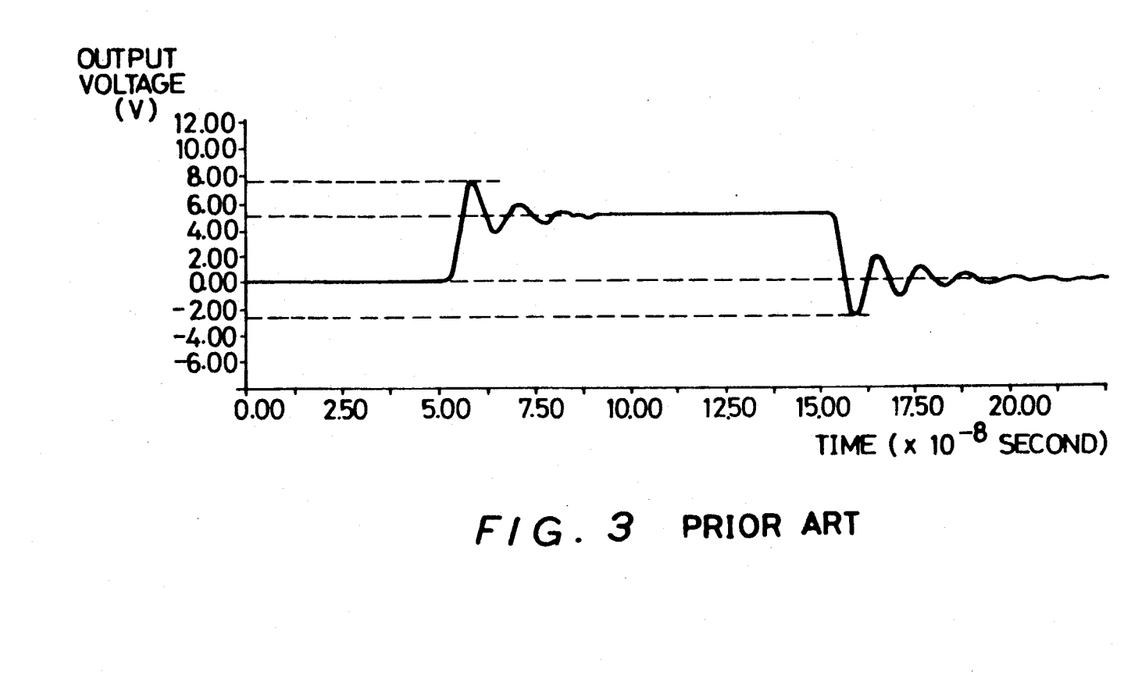
FIG. 3 illustrates changes in the output voltage of the conventional output circuit shown in FIG. 1.

In this circuit, as the channel widths of the respective transistors are increased to thereby increase their current driving capability so that the output circuit can operated at a higher speed, the ON-state resistance $R_{ON}$ of the transistors decreases, which, in turn, makes the value of Q increase, as is understood from the equation (2). This causes the output circuit including a load to oscillate, being excited by changes of the output voltage level from H to L and from L to H, so that ringing occurs in the output waveform. FIG. 3 is an example of an output voltage waveform resulting when the output voltage level changes. This waveform has been obtained by simulation. As shown in FIG. 3, when the output voltage changes either from L to H or H to L, relatively large ringing, including a maximum voltage excursion of a magnitude of up to about 60% of the difference between the two levels, occurs. Ringing generates noise during signal transmission, which may cause an erroneous operation of a logic circuit system and may also generate undesired radiation that interferes with operations of other electronic systems.

As described above, a conventional output circuit such as the one shown in FIG. 1 has a problem that, as the current driving capability is increased to speed up the driving operation of the circuit, ringing occurs in the output voltage waveform of the circuit. In order to suppress such ringing, a damping resistor may be connected in series with the output terminal, or a certain amount of slew may be introduced into an input signal at the input terminal 11 of the output circuit (to provide slew rate control). However, such techniques are not desirable, because, in integrated circuits, in particular, a damping resistor or a slew rate control circuit requires a large area and, in case of slew rate control, a complex circuit arrangement is required.

An object of the present invention is to eliminate the above-described problem associated with conventional output circuits as described above, by providing an MOS transistor output circuit which can drive a capacitive load at a high speed and which hardly causes ringing to occur in its output voltage waveform.

SUMMARY OF THE INVENTION

In terms of illustrated embodiments which will be described later in detail, an MOS transistor output circuit according to the present invention includes an L-level output section and an H-level output section at least one of which includes a grounded-source transistor of one conductivity type, and a grounded-drain transistor (source-follower transistor) of the other conductivity type. The grounded-source transistor has its gate connected to an input terminal 11 of the MOS transistor output circuit, has its drain connected to an output terminal 12 of the MOS transistor output circuit, and has its source connected to a point of ground potential or to a $V_{DD}$ voltage supply terminal. The grounded-drain transistor has its gate connected through an inverter 21 to the input terminal 11, has its source connected to the output terminal 12, and has its drain connected to the point of ground potential or to the $V_{DD}$ voltage supply terminal. The grounded-drain transistor has a ratio of the channel width to the channel length (channel width-to-length ratio) which is two times or more as large as the channel width-to-length ratio of the grounded-source transistor.

In the MOS transistor output circuit with the above-described arrangement, both the grounded-source transistor and the grounded-drain transistor having a channel width-to-length ratio which is two times or more as large as that of the grounded-source transistor are conductive during a most portion of a transition time period, including a first half portion thereof, during which the level of an output of the MOS transistor output circuit changes from H to L or from L to H, whereby a large current driving capability is fully utilized to drive a load at a high speed. At a time point near the end of the transition time period, at which the output voltage approaches a desired logic level, the grounded-drain transistor is rapidly turned off to reduce the current driving capability of the MOS transistor output circuit, resulting in increase of the ON-state resistance $R_{ON}$ of the MOS transistor output circuit. This can prevent the occurrence of ringing in the output voltage waveform, while driving the load at a high speed even when the load includes capacitance.

DETAILED DESCRIPTION OF PREFERRED EMBODIMENTS

Now, the present invention is described in detail by means of embodiments illustrated in the drawings.

Figure 4:
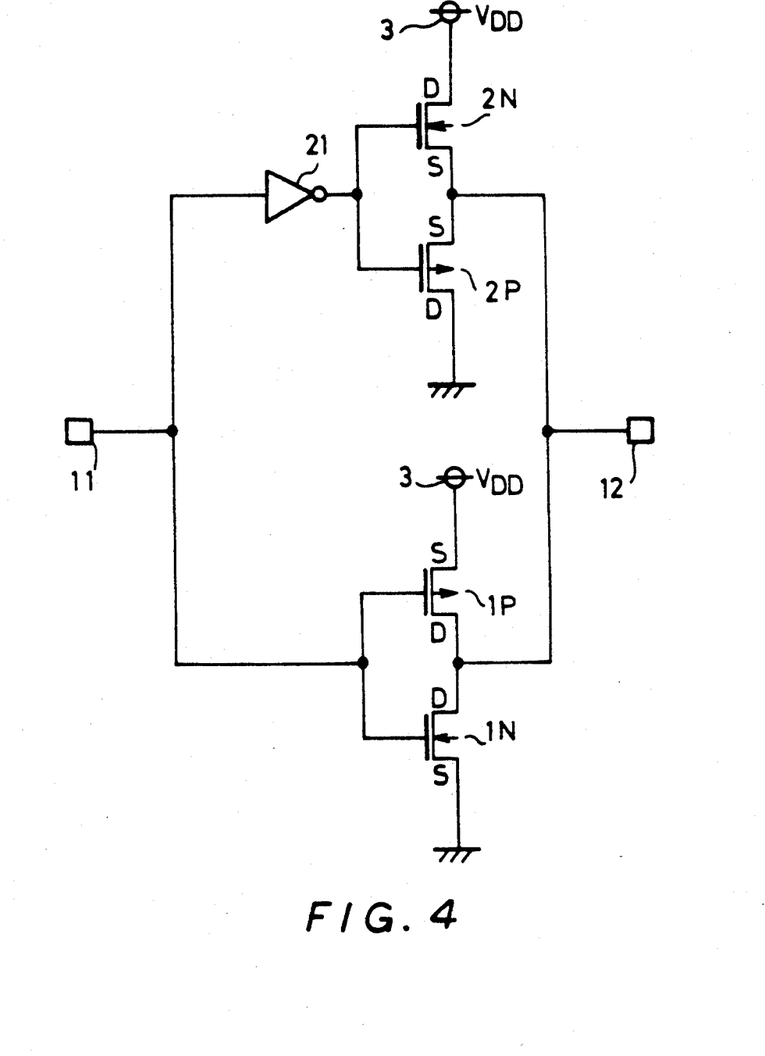
FIG. 4 shows a circuit according to a first embodiment of the present invention.

FIG. 4 shows an MOS transistor output circuit according to a first embodiment of the present invention. This circuit functions as an inverter, and includes a first N-channel transistor 1N, a source-follower second N-channel transistor 2N, a first P-channel transistor 1P, and a source-follower second P-channel transistor 2P.

The first N-channel transistor 1N and the source-follower second P-channel transistor 2P form an L-level output section which provides an L-level output at an output terminal 12. The first N-channel transistor 1N has its gate coupled to an input terminal 11, has its drain coupled to an output terminal 12, and has its source grounded, and the second P-channel transistor 2P has its gate coupled to the output of an inverter 21, has its source electrode coupled to the output terminal 12, and has its drain grounded.

The first P-channel transistor 1P and the source-follower second N-channel transistor 2N form an H-level output section which provides an H-level output at the output terminal 12. The first P-channel transistor 1P has its gate coupled to the input terminal 11, has its drain coupled to the output terminal 12, and has its source coupled to a $V_{DD}$ voltage supply terminal 3, and the second N-channel transistor 2N has its gate coupled to the output of the inverter 21, has its source coupled to the output terminal 12, and has its drain coupled to the voltage supply terminal 3. The input of the inverter 21 is coupled to the input terminal 11.

The channel width-to-length ratio of the L-level output section second P-channel transistor 2P connected as a source-follower is two times or more as large as that of the grounded-source first N-channel transistor 1N. Similarly, the channel width-to-length ratio of the H-level output section second N-channel transistor 2N connected in a source-follower configuration is two times or more as large as that of the grounded-source first P-channel transistor 1P.

Figure 5:
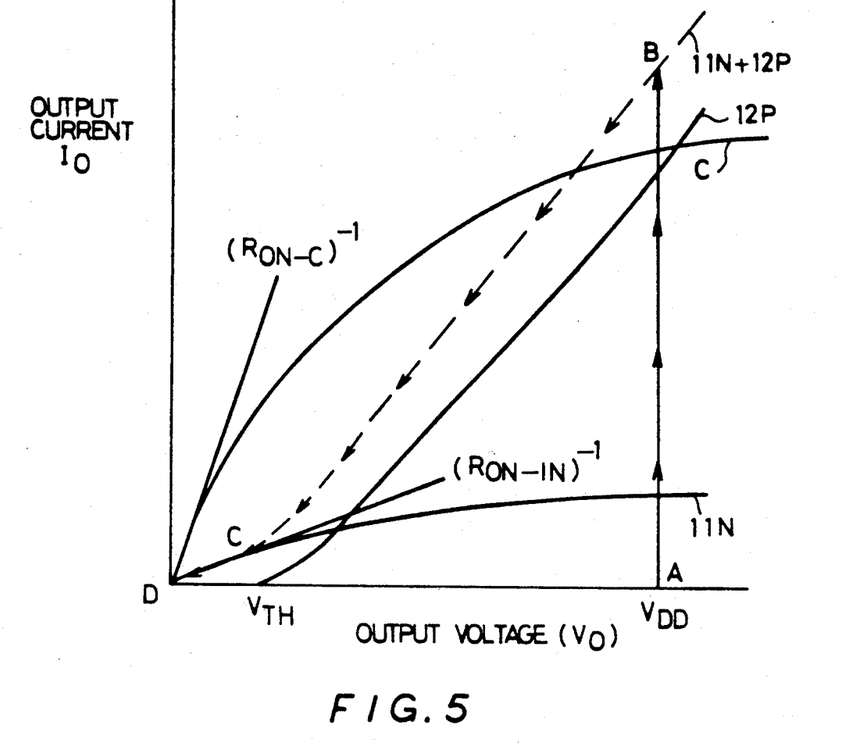
FIG. 5 shows characteristics of the respective transistors and the output circuit of FIG. 4 useful in explaining the operation of the circuit of FIG. 4.

Now, the output current ($I_o$) versus output voltage ($V_o$) characteristic of the L-level output circuit is explained with reference to FIG. 5. In FIG. 5, a curve 11N represents the output characteristic of the N-channel transistor 1N. The curve 11N shows that the transistor 1N has a small channel width-to-length ratio, a small ON-state current, and a large ON-state internal resistance. In contrast, as stated previously, the P-channel transistor 2P has a large channel width-to-length ratio and, hence, a large current capacity, and has a significantly large current driving capability. However, since the transistor 2P operates as a source-follower, it is rapidly turned off as the output voltage decreases to approach its gate-source threshold voltage $V_{TH}$. The output characteristic of the transistor 2P is as represented by a curve 12P. Then, the combined output characteristic of the L-level output section formed by the parallel combination of the transistors 1N and 2P is as represented by a curve 11N+12P in FIG. 5.

Similarly, the H-level output section, which comprises the transistors 1P and 2N, has an overall output characteristic similar to that represented by the curve 11N+12P, with the transistors 1P and 2N having output characteristics resembling to those represented by the curves 11N and 12P, respectively.

Now, the operation of the output circuit of FIG. 4 is described in sequence.

(1) When Input Terminal 11 is at L Level

When the input terminal 11 is at the low level, the first P-channel transistor 1P is conductive, while the first N-channel transistor 1N is non-conductive. Because of the presence of the inverter 21, the gate of the second P-channel transistor 2P is at the high level so that the transistor 2P is non-conductive. Thus, the output terminal 12 is placed at the H level. At the same time, the gate of the second N-channel transistor 2N is at the H level. However, its source is also at the H level since the output terminal 12 is at the H level, and, accordingly, the gate-source voltage of the transistor 2N is less than the threshold voltage. Therefore, the transistor 2N is non-conductive.

(2) When Input Terminal Has Changed from L Level to H Level

Both the first N-channel transistor 1N and the second P-channel transistor 2P become conductive, so that the operating point of the output circuit rapidly moves upward from a point A to a point B on the characteristic curve 11N+12P, so that the MOS transistor output circuit comes to exhibit a large current driving capability. When the level at the output terminal 12 decreases toward the ground potential and approaches a point C, the gate-source voltage of the transistor 2P becomes less than the threshold voltage and the transistor 2P is turned off. Accordingly, in the range between the point C to a point D shown in FIG. 5, the ON-resistance $R_{ON}$ of the L-level output section is substantially equal to the ON-resistance $R_{ON-1N}$ of the transistor 1N, as expressed as $(R_{ON-1N})^{-1}$ in FIG. 5, whereby the ON-resistance $R_{ON}$ of the L-level output section is prevented from becoming excessively small, which, in turn, prevents Q from increasing. Thus, occurrence of ringing in the output voltage waveform at the output terminal 12 is suppressed.

(3) When Input Terminal 11 Is at H Level

Only the first N-channel transistor 1N is conductive so that the output terminal 12 is held at the L level. Due to the inverting action of the inverter 21, an L level is applied to the gate of the second P-channel transistor 2P. However, the L level at the output terminal 12 is coupled to the source of the transistor 2P, and, accordingly, the gate-source voltage becomes less than the threshold value. Thus, the transistor 2P is non-conductive.

(4) When Input Terminal 11 Changes from H Level to L Level

Through the same process as stated in the above (2), initially the first P-channel transistor 1P and the second N-channel transistor 2N of the H-level output section are simultaneously turned on to drive the load with a large current driving capability, and finally, only the P-channel transistor 1P is conductive so that the output terminal 12 is placed to the H level. In this case, too, near the end of the transition period, the ON-resistance of the H-level output section is that of the conducting first P-channel transistor 1P, and, thus, the ON-resistance $R_{ON}$ of the H-level output section is prevented from excessively decreasing. Thus, the occurrence of ringing is suppressed.

Figure 6:
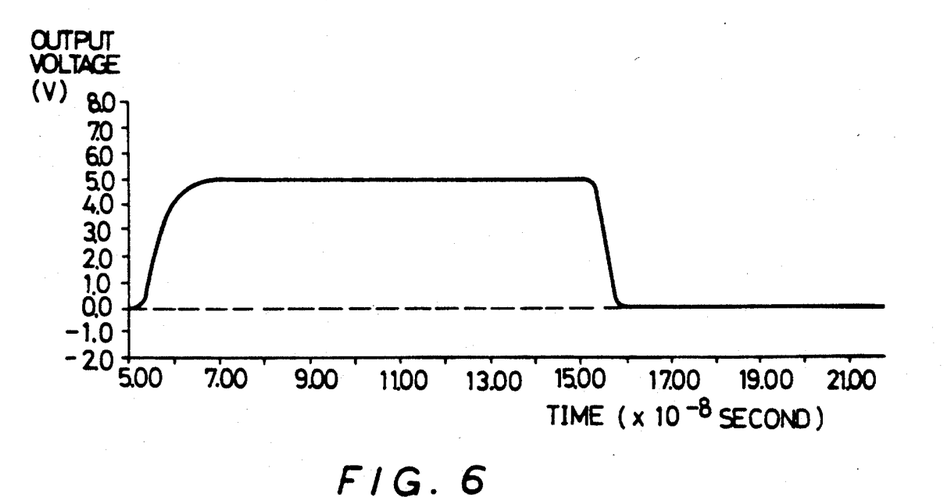
FIG. 6 shows how the output voltage from the circuit of FIG. 4 changes.

FIG. 6 shows an output voltage waveform which as been obtained by simulation. This output voltage waveform would result from connecting a load comprising an inductance $L_{31}$ and capacitance $C_{32}$ of the same magnitudes as those of the inductance 31 and the capacitance 32 in FIG. 2. It is seen from FIG. 6 that ringing is substantially completely eliminated.

In the embodiment shown in FIG. 4, only one inverter, namely, the inverter 21, is used, but separate inverters may be used for the respective transistors 2P and 2N to connect the respective gates to the input terminal 11.

Figure 7:
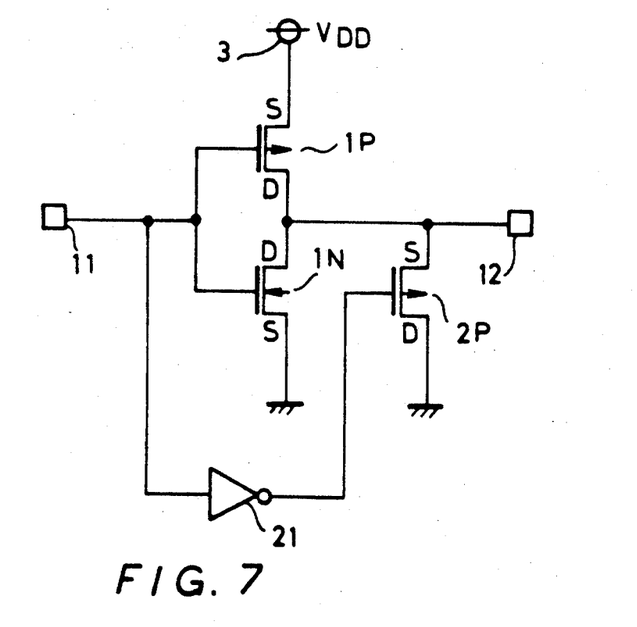
FIG. 7 shows an output circuit according to a second embodiment of the present invention.

FIG. 7 shows an MOS transistor output circuit according to a second embodiment of the present invention. The L-level output section of this output circuit is similar to that of the embodiment shown in FIG. 4 and is formed by an N-channel transistor 1N, a P-channel transistor 2P having a channel width-to-length ratio which is two times or more as large as that of the transistor 1N, and an inverter 21. The H-level output section of this MOS transistor output circuit is similar to that of the conventional output circuit shown in FIG. 1 and comprises only one P-channel transistor 1P.

In logic circuit applications, sometimes a high operation speed may be required only at either a rising or falling edge of an output voltage waveform, or only ringing either in a rising edge or in a falling edge may pose serious problem.

The embodiment shown in FIG. 7 is particularly useful in applications in which the operation speed at times when the output voltage at an output terminal 12 changes from an L level to an H level is not very important and ringing which may occur in such transitions is not very critical, but in which the operation speed when the output voltage changes from the H level to the L level must be high and ringing which could occur at such transistions must be suppressed.

Depending on applications of MOS transistor output circuits of the present invention, the H-level output section may be the same as that of the output circuit of FIG. 4 comprising the first P-channel transistor 1P, the second N-channel transistor 2N and the inverter 21, and the L-level output section may comprise one N-channel transistor 1N only, as in the conventional circuit shown in FIG. 1.

Figure 8:
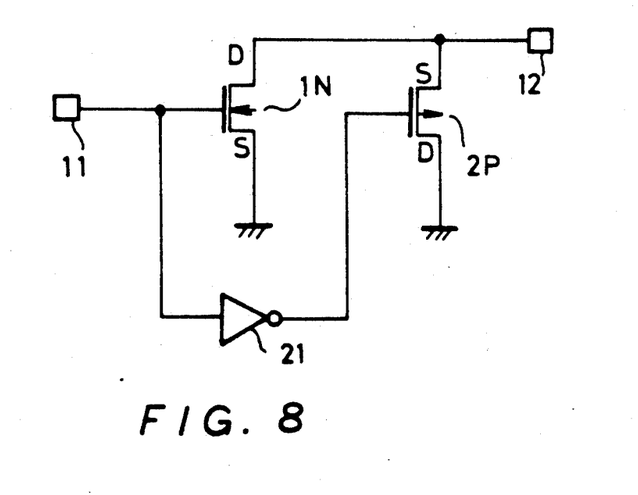
FIG. 8 shows an output circuit according to a third embodiment of the present invention.

FIG. 8 shows an MOS transistor output circuit according to a third embodiment of the present invention. This output circuit is a so-called open-drain type output circuit. This output circuit includes an L-level output section connected between an output terminal 12 and a point of ground potential. The L-level output section is similar to that of the output circuit shown in FIG. 4 and comprises an N-channel transistor 1N, a P-channel transistor of which the channel width-to-length ratio is two times or more as large as that of the transistor 1N, and an inverter 21.

In operation, when an input terminal 11 is at an H level, the output terminal 12 is at an L level, and when the input terminal 11 is at the L level, the output terminal 12 exhibits a high impedance (i.e. it becomes floating). In this circuit, too, the output terminal 12 can be rapidly driven to the L level and no ringing occurs in the output waveform.

Figure 9:
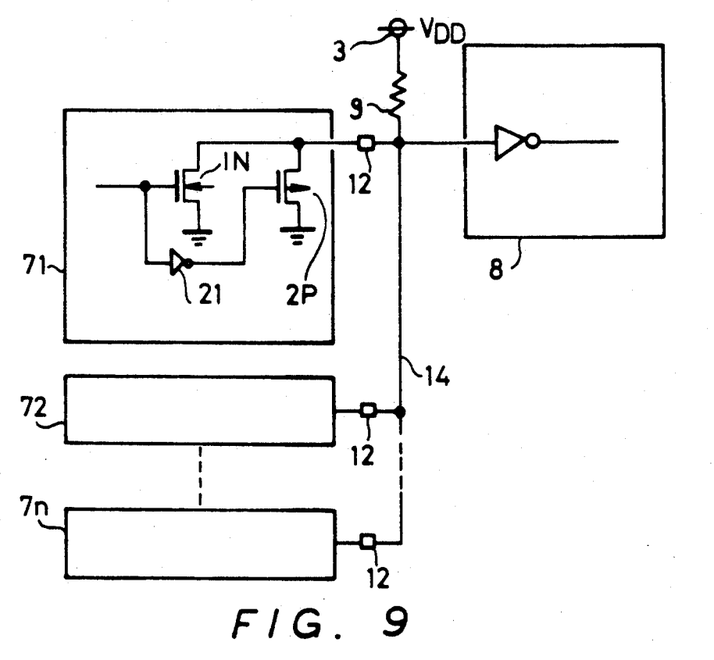
FIG. 9 shows how to use the circuit of FIG. 8.

FIG. 9 illustrates an example of how to use the circuit of FIG. 8. Output circuits 71, 71, . . . , 7n, each of which has the same circuit configuration as that shown in FIG. 8, have their respective output terminals 12 connected through a bus 14 to a load resistor 9 and also to an IC (e.g. microcomputer) 8. One end of the resistor 9 is connected to a $V_{DD}$ voltage supply terminal 3.

When the output terminals 12 of any one of the output circuits 71–7n is placed to the L level, an L-level signal is applied to the IC 8, and when the output terminals 12 of all of the output circuits 71–7n are in the high impedance state (i.e. in the floating state), a voltage $V_{DD}$ or H-level signal is applied through the resistor 9 to the IC 8.

The output circuits shown in FIGS. 4 and 7 cannot be used in this manner, because both L and H levels are developed at the output terminal 12.

Another type of an open-drain output circuit comprises an H-level output section connected between the output terminal 12 and the $V_{DD}$ voltage supply terminal, with the L-level output section opened. The H-level output section is similar to that of the output circuit of FIG. 4 which comprises the P-channel transistor 1P, the N-channel transistor 2N, and the inverter 21. When the input terminal 11 is at the L level, the output terminal is at the H level, and when the input terminal is at the H level, the output terminal is in the high impedance state (i.e. in the floating state).

Figure 10:
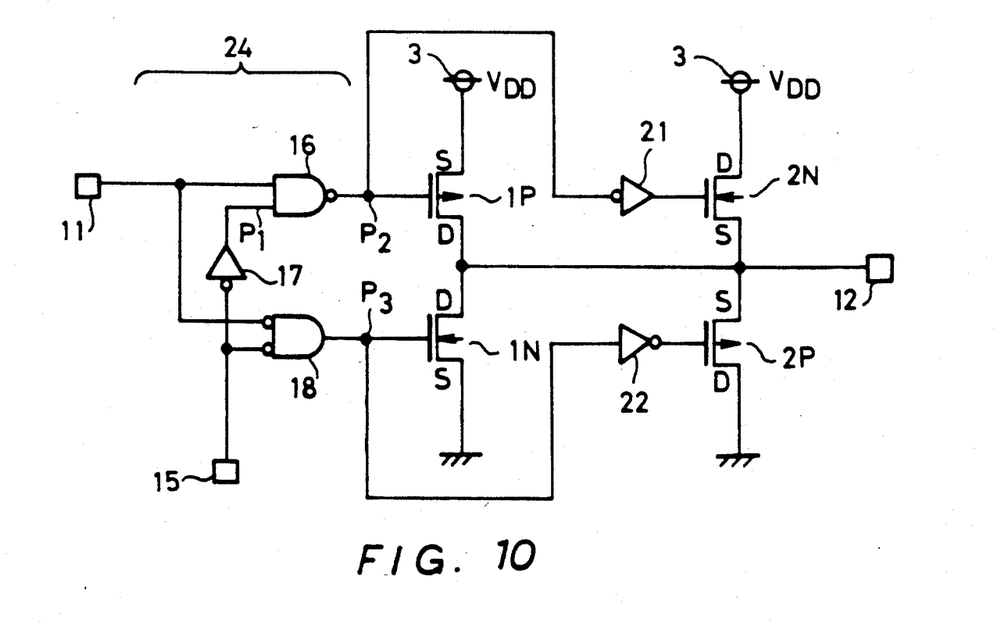
FIG. 10 shows how to use the circuit of FIG. 4.

FIG. 10 illustrates an example of how to use the MOS transistor output circuit of FIG. 4. A high impedance control logic circuit 24 for placing the output terminal in the high impedance, floating state is connected between the input terminal 11 and the L-level and H-level output sections. In the circuit shown in FIG. 10, an inverter 21, 22 is connected to the gate of each of the second P-channel and N-channel transistors 2P and 2N.

As shown in FIG. 10, the high impedance control circuit 24 includes an output-negation AND circuit (equivalent to an NAND circuit) 16 which has its first input connected to the input terminal 11 and has its output connected to the gate of the first P-channel transistor 1P and also to the gate of the second N-channel transistor 2N through the inverter 21. The high impedance control circuit 24 includes further an input-negation AND circuit (equivalent to an NOR circuit) 18 which has its first input connected to the input terminal 11 and has its output connected to the gate of the N-channel transistor 1N and also to the gate of the second P-channel transistor 2P through the inverter 22. The circuit 24 includes also an inverter 17 which is connected between a control input terminal 15 and the second input of the AND circuit 16. The second input of the AND circuit 18 is connected directly to the control input terminal 15.

Figure 11:
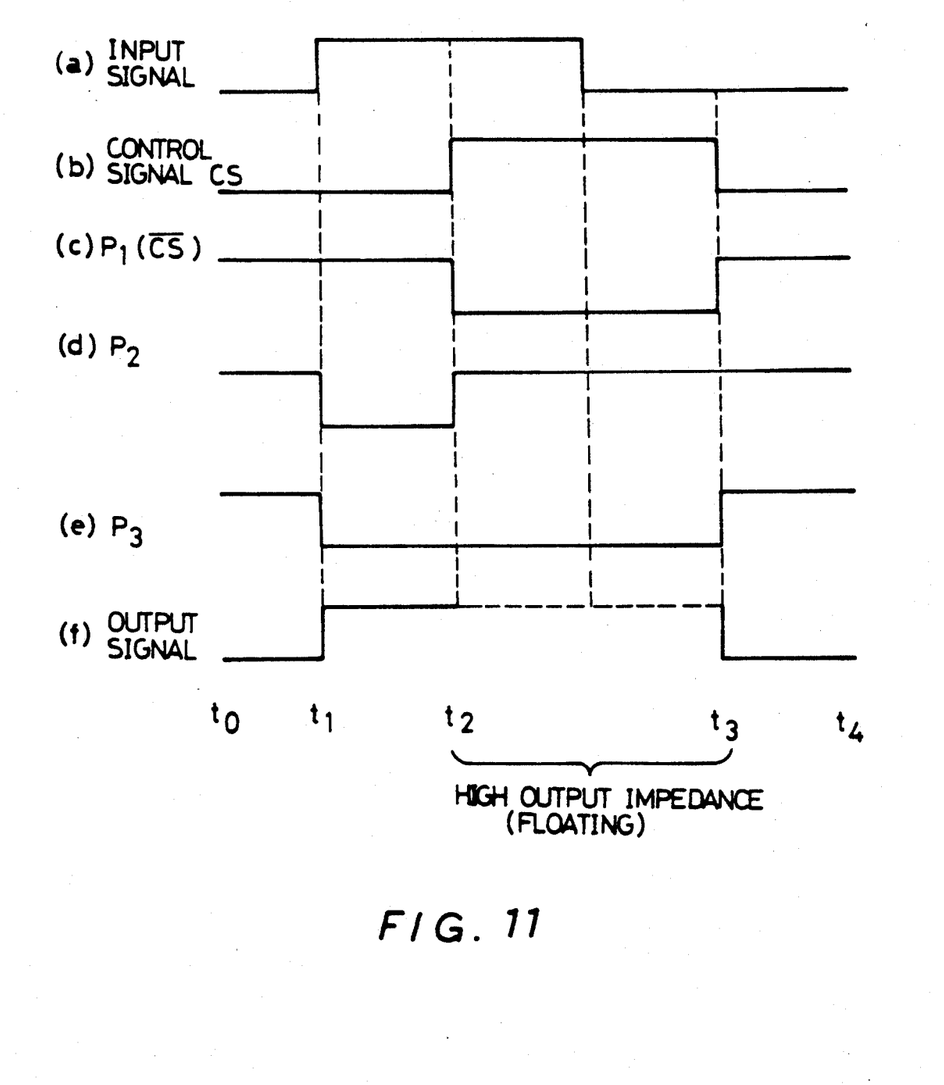
FIG. 11 shows various waveforms helpful in understanding the operation of FIG. 10.

The operation of the MOS transistor output circuit shown in FIG. 10 is now described with reference to FIG. 11 which illustrates signal levels at various portions of the circuit. In FIG. 11, (a) shows the level of an input signal applied to the input terminal 11. (b) shows a control signal CS applied to the control input terminal 15. (c) shows a signal at a point $P_1$, which is $\overline{CS}$. Thus, the signal levels at points $P_2$ and $P_3$ in FIG. 10 are as shown in FIGS. 11(d) and 11(e), respectively. During intervals $t_0-t_1$ and $t_3-t_4$ during which the points $P_2$ and $P_3$ are both at the H level, the output terminal 12 is at the L level. During an interval $t_1-t_2$ during which both $P_2$ and $P_3$ are at the L level, the output terminal 12 is at the H level. However, during an interval $t_2-t_3$ during which the control signal CS applied to the control input terminal 15 is at the H level, the level at the point $P_2$ is high (H) and the level at the point $P_3$ is low (L), which causes both the L-level and H-level output sections to become non-conductive. Then, the output terminal 12 exhibits the high impedance state, i.e. it is placed in the floating state. In this way, the state of the output terminal 12 can be controlled in accordance with the level of the control signal CS applied to the control input terminal 15.

The MOS transistor output circuit of FIG. 10 can also drive a load at a high speed when the output signal changes from L to H or from H to L in response to changes of an input signal applied thereto. Further, the ON-resistance $R_{ON}$ of the output circuit is prevented from excessively increasing so that the occurrence of ringing can be suppressed.

As described above, in the MOS transistor output circuit of the present invention, a parallel combination circuit of first and second circuits including transistors having different output characteristics is connected in either or both of the paths between the output terminal and a point of ground potential and between the output terminal and a $V_{DD}$ voltage supply terminal. When an input signal level changes, the first and second circuits both are conductive to provide a large current driving capability which can make the output voltage level change rapidly until the output voltage approaches a predetermined level, and when the output voltage reaches the predetermined level, one of the two circuits is rendered non-conductive to thereby prevent the ON-resistance $R_{ON}$ of the MOS transistor output circuit from becoming excessively small so as to limit the current driving capability. Thus, when the MOS transistor output circuit is used to drive a load including capacitance at a high speed, occurrence of ringing in the output voltage can be effectively prevented. Thus, according to the present invention, both high speed driving of a load and suppression of ringing can be achieved with a simple circuit arrangement.

What is claimed is:

1. An MOS transistor output circuit comprising:
   an L-level output section connected between an output terminal of said MOS transistor output circuit and a point of ground potential; and
   an H-level output section connected between said output terminal and a $V_{DD}$ voltage supply terminal;
   said L-level output section comprising:
   a grounded-source first N-channel transistor having its gate connected to an input terminal of said MOS transistor output circuit, having its drain connected to said output terminal, and having its source connected to a point of ground potential; and
   a source-follower second P-channel transistor having its gate connected to said input terminal through an inverter, having its drain connected to a point of ground potential, and having its source connected to said output terminal;
   said H-level output section comprising:
   a first P-channel transistor having its gate connected to said input terminal, having its drain connected to said output terminal, and having its source connected to said $V_{DD}$ voltage supply terminal;
   a source-follower second N-channel transistor having its gate connected to said input terminal through said inverter, having its drain connected to said $V_{DD}$ voltage supply terminal, and having its source connected to said output terminal; and
   a channel width-to-length ratio of said second P-channel and N-channel transistors being at least two times as large as that of said first P-channel and N-channel transistors.

2. An MOS transistor output circuit comprising:
   an L-level output section connected between an output terminal of said MOS transistor output circuit and a point of ground potential; and
   an H-level output section connected between said output terminal and a $V_{DD}$ voltage supply terminal;
   said H-level output section comprising a first P-channel transistor having its gate connected to an input terminal of said MOS transistor output circuit, having its drain connected to said output terminal and having its source connected to said $V_{DD}$ voltage supply terminal; and
   said L-level output section comprising:
   a grounded-source N-channel transistor having its gate connected to said input terminal, having its drain connected to said output terminal, and having its source connected to a point of ground potential;

a source-follower P-channel transistor having its gate connected to said input terminal through an inverter, having its drain connected to a point of ground potential, and having its source connected to said output terminal; and a channel width-to-length ratio of said source-follower P-channel transistor being at least two times as large as that of said grounded-source N-channel transistor.

3. An MOS transistor output circuit comprising;

an L-level output section connected between an output terminal of said MOS transistor output circuit and a point of ground potential;

an H-level output section connected between said output terminal and a $V_{DD}$ voltage supply terminal;

said L-level output section comprising a grounded-source N-channel transistor having its gate connected to an input terminal of said MOS transistor output circuit, having its drain connected to said output terminal and having its source connected to a point of ground potential;

said H-level output section comprising:

a first P-channel transistor having its gate connected to said input terminal, having its drain connected to said output terminal, and having its source connected to said $V_{DD}$ voltage supply terminal;

a source-follower N-channel transistor having its gate connected to said input terminal through an inverter, having its drain connected to said $V_{DD}$ voltage supply terminal, and having its source connected to said output terminal; and a channel width-to-length ratio of said source-follower N-channel transistor being at least two times as large as that of said first P-channel transistor.

4. An open-drain MOS transistor output circuit comprising:

an L-level output section connected between an output terminal of said MOS transistor output circuit and a point of ground potential;

said L-level output circuit comprising:

a grounded-source N-channel transistor having its gate connected to an input terminal of said MOS transistor circuit, having its drain connected to said output terminal, and having its source connected to a point of ground potential;

a source-follower P-channel transistor having its gate connected to said input terminal through an inverter, having its drain connected to a point of ground potential, and having its source connected to said output terminal; and a channel width-to-length ratio of said P-channel transistor being at least two times as large as that of said N-channel transistor.

5. An open-drain MOS transistor output circuit comprising:

an H-level output section connected between an output terminal of said MOS transistor output circuit and a $V_{DD}$ voltage supply terminal;

said H-level output circuit comprising:

a first P-channel transistor having its gate connected to an input terminal of said MOS transistor circuit, having its drain connected to said output terminal, and having its source connected to said $V_{DD}$ voltage supply terminal;

a source-follower N-channel transistor having its gate connected to said input terminal through an inverter, having its drain connected to said $V_{DD}$ voltage supply terminal, and having its source connected to said output terminal; and the channel width-to-length ratio of said N-channel transistor being two times or more as large as that of said P-channel transistor.

6. An MOS transistor output circuit comprising:

a first MOS transistor;

a second MOS transistor;

said first MOS transistor and said second MOS transistor being connected for parallel conduction of current;

said second MOS transistor having a channel width-to-length ratio at least twice a channel width-to-length ratio of said first MOS transistor;

means for turning on said first MOS transistor and said second MOS transistor for simultaneous passage of current in parallel therethrough during one of a rising and a falling transition, whereby a high current-carrying capacity is provided during said transition; and means for turning off said second MOS transistor upon completion of said transition, whereby an effective source resistance of said MOS transistor output circuit remains high to reduce ringing at high speeds.

7. Apparatus according to claim 6, wherein said means for turning off includes:

said second MOS transistor being connected as a source-follower;

means for inverting an input signal and applying a resulting inverted input signal to a gate of one of said first MOS transistor and said second MOS transistor and for feeding said input signal to a gate of the other thereof non-inverted so as to turn-on both said first and second MOS transistors; and connecting a drain of said first MOS transistor to a source of said second MOS transistor, whereby an output signal of said first MOS transistor is of correct polarity and amplitude to cut off said second MOS transistor upon completion of said transition when inputs to the gates thereof are complementary.

8. Apparatus according to claim 6, wherein said first MOS transistor is a PMOS transistor and said second MOS transistor is an NMOS transistor.

9. Apparatus according to claim 6, wherein one of said first and second MOS transistors is a PMOS transistor and the other thereof is an NMOS transistor.

10. An MOS transistor output circuit comprising: a complementary pair of a NMOS transistor and a PMOS transistor having their source-drain paths connected in series between a voltage $V_{DD}$ and ground;

gates of said complementary pair being connected to a signal source;

drains of said complementary pair being connected to an output terminal;

at least one additional MOS transistor;

means for inverting said signal source for application to a gate of said at least one additional MOS transistor;

a drain of said at least one additional MOS transistor being connected to one of said voltage $V_{DD}$ and ground;

a source of said at least one additional MOS transistor being connected to said output terminal; and a width-to-length ratio of said at least one additional MOS transistor being at least twice as large as a width-to-length ratio of at least one of said NMOS transistor or said PMOS transistor.

11. An MOS transistor output circuit comprising:

a complementary pair of a NMOS transistor and a PMOS transistor having their source-drain paths connected in series between a voltage $V_{DD}$ and ground;

gates of said complementary pair being connected to a signal source;

drains of said complementary pair being connected to an output terminal;

at least one additional MOS transistor;

means for inverting said signal source for application to a gate of said at least one additional MOS transistor;

a drain of said at least one additional MOS transistor being connected to one of said voltage $V_{DD}$ and ground;

a source of said at least one additional MOS transistor being connected to said output terminal; and said at least one additional MOS transistor including an additional complementary pair MOS transistors consisting of an additional NMOS transistor and an additional PMOS transistor having their source-drain paths connected in series between said voltage $V_{DD}$ and ground.

12. An MOS output circuit comprising:

an H level section consisting of a first PMOS transistor and a first NMOS transistor;

a source of said first PMOS transistor being connected to a voltage $V_{DD}$;

a drain of said first PMOS transistor being connected to an output terminal;

a drain of said first NMOS transistor being connected to said voltage $V_{DD}$;

a source of said first NMOS transistor being connected to said output terminal;

an inverter connecting a first input signal from a gate of said first PMOS transistor to a gate of said first NMOS transistor;

an L level section consisting of a second NMOS transistor and a second PMOS transistor;

a drain of said second NMOS transistor being connected to said output terminal a source of said second NMOS transistor being connected to ground;

a source of said second PMOS transistor being connected to said output terminal;

a drain of said second PMOS transistor being connected to ground; and an inverter connecting a second input signal from a gate of said second NMOS transistor to a gate of said second PMOS transistor.

13. Apparatus according to claim 12, further comprising logic means for producing said first and second input signals in at least the combinations HH, LL, and LH, respectively, where H and L represent high and low level signals respectively and the first and second positions in the combinations correspond to the indicated level being applied to said first and second input signals.

14. Apparatus according to claim 13, wherein said logic means is responsive to a main input signal and a control signal for producing said combinations.

15. Apparatus according to claim 13, wherein said logic means includes means for producing an L output from said MOS transistor output circuit in the presence of a first combination of conditions of said main input signal and said control signal, an H output in the presence of a second combination of conditions, and a floating output in the presence of a third combination of said conditions.

16. Apparatus according to claim 15, wherein said first combination includes said main input signal and said control signal both being L.

17. Apparatus according to claim 15, wherein said second combination includes said main input signal being H and said control signal being L.

18. Apparatus according to claim 15, wherein said third combination includes said control signal being H.

* * * * *